(12) United States Patent
Schiller et al.

(10) Patent No.: US 6,451,180 B1
(45) Date of Patent: Sep. 17, 2002

(54) METHOD OF MAKING A PVD $AL_2O_3$ COATED CUTTING TOOL

(75) Inventors: Siegfried Schiller; Klaus Goedicke; Fred Fietzke; Olaf Zywitzki, all of Dresden (DE); Mats Sjöstrand, Kista; Björn Ljungberg, Enskede, both of (SE)

(73) Assignee: Sandvik AB, Sandviken (SE)

( * ) Notice: Subject to any disclaimer, the term of this patent is extended or adjusted under 35 U.S.C. 154(b) by 0 days.

(21) Appl. No.: 09/563,419

(22) Filed: May 2, 2000

(30) Foreign Application Priority Data

May 6, 1999 (SE) .............................................. 9901650

(51) Int. Cl.[7] .............................................. C23C 14/34
(52) U.S. Cl. .............................. 204/192.15; 204/192.22
(58) Field of Search ....................... 204/192.16, 192.22, 204/192.15, 298.15, 298.08

(56) References Cited

U.S. PATENT DOCUMENTS

| | | | |
|---|---|---|---|
| 5,478,634 A | 12/1995 | Setoyama et al. | 428/212 |
| 5,487,625 A | 1/1996 | Ljungberg et al. | 407/119 |
| 5,503,912 A | 4/1996 | Setoyama et al. | 428/212 |
| 5,516,588 A | 5/1996 | van den Berg et al. | 427/10 |
| 5,587,233 A | 12/1996 | Konig et al. | 427/314 |
| 5,674,564 A | 10/1997 | Ljungberg et al. | 427/255.34 |
| 5,679,448 A * | 10/1997 | Kawata | 428/216 |
| 5,693,417 A | 12/1997 | Goedicke et al. | 204/192.1 |
| 5,698,314 A | 12/1997 | Goedicke et al. | 204/192.1 |
| 5,700,551 A | 12/1997 | Kukino et al. | 427/419.1 |
| 5,861,210 A | 1/1999 | Lenander et al. | 407/119 |
| 5,888,305 A * | 3/1999 | Szczyrbowski et al. | 204/298.06 |
| 6,083,356 A * | 7/2000 | Goedicke et al. | 204/164 |

FOREIGN PATENT DOCUMENTS

| | | |
|---|---|---|
| DE | 252 205 | 12/1987 |
| EP | 744 473 | 4/1996 |
| GB | 1 408 294 | 7/1972 |

OTHER PUBLICATIONS

Thornton & Chin, Cer Bul 56(1977)504.
Bunshah & Schramm, Thin Solid Films 40(1977)211.
F. Fietzke et al., "The deposition of hard crystalline, $Al_2O_3$ layers by means of bipolar pulsed magnetron sputtering", Surface & Coatings Technology, 86–87, pp. 657–663, 1996.
O. Zywitzki et al., "Effect of the substrate temperature on the structure and properties of $Al_2O_3$ layers reactively deposited by pulsed magnetron sputtering", Surface and Coatings Technology 82 (1996) pp. 169–175.
O. Zywitzki et al., "Correlation between structure and properties of reactively deposited $Al_2O_3$ coatings by pulsed magnetron sputtering", Surface & Coatings Technology, 94–95, 1997 pp. 303–308.
F. Fietzke et al., "Pulsed Magnetron of Alumina Films: Crystalline Phases at Low Temperatures", No. 279 Jan.–Feb.–Mar. 1996, pp. 218–220.

* cited by examiner

Primary Examiner—Patrick Ryan
Assistant Examiner—Gregg Cantelmo
(74) Attorney, Agent, or Firm—Burns, Doane, Swecker & Mathis, L.L.P.

(57) ABSTRACT

The present invention relates to a process for producing a coated cutting tool consisting of a coating and a substrate, wherein at least one refractory layer consisting of fine-grained, crystalline $\gamma$-$Al_2O_3$ is deposited by reactive magnetron sputtering onto the moving substrate in a vacuum by pulsed magnetron sputtering in a mixture of a rare gas and a reactive gas at a pulse frequency set for 10 to 100 kHz. The deposition occurs with a rate of at least 1 nm/s with reference to a stationarily arranged substrate at a magnetron target power density in time average set for at least 10 $W/cm^2$. The substrate temperature is in the range 400 to 700° C. and the flux of impinging particles onto each individual substrate is cyclically interrupted.

20 Claims, No Drawings

METHOD OF MAKING A PVD AL₂O₃ COATED CUTTING TOOL

BACKGROUND OF THE INVENTION

The present invention relates to an improved method of depositing at least one layer of fine-crystalline γ-Al₂O₃ by reactive magnetron sputtering technique onto a cutting tool for metal machining.

It is well-known that for, e.g., cemented carbide cutting tools used in metal machining, the wear resistance of the tool edge can be increased considerably by applying thin, hard surface layers of metal oxides, carbides or nitrides with the metal either selected from the transition metals from the groups IV, V and VI of the Periodic Table or from silicon, boron and aluminum. The coating thickness usually varies between 1 and 15 μm and the most widespread techniques for depositing such coatings are PVD and CVD (Chemical Vapor Deposition). It is also well-known that further improvements of the performance of a cutting tool can be achieved by applying a pure ceramic layer such as Al₂O₃ on top of layers of metal carbides and nitrides (U.S. Pat. Nos. 5,674,564 and 5,487,625).

Cemented carbide cutting tools coated with alumina layers have been commercially available for over two decades. The CVD technique usually employed involves the deposition of material from a reactive gas atmosphere on a substrate surface held at elevated temperatures. Al₂O₃ crystallizes into several different phase such as α (alpha), κ (kappa) and χ (chi), called the "α-series" with hcp (hexagonal close packing) stacking of the oxygen atoms, and into γ (gamma), θ (theta), η (eta) and δ (delta), called the "γ-series" with fcc (face centered cubic) stacking of the oxygen atoms. The most often occurring Al₂O₃-phases in CVD coatings deposited on cemented carbides at conventional CVD temperatures, 1000°–1050° C., are the stable alpha and the metastable kappa phases, however, occasionally the metastable theta phase has also been observed.

The CVD Al₂O₃-coatings of the α-, κ- and/or θ-phase are fully crystalline with a grain size in the range of 0.5–54 μm and having well-faceted grain structures.

The inherently high deposition temperature of about 1000° C. renders the total stress in CVD Al₂O₃-coatings on cemented carbide substrates to be tensile, hence the total stress is dominated by thermal stresses caused by the difference in thermal expansion coefficients between the substrate and the coating and less by intrinsic stresses which have their origin from the deposition process itself and are of compressive nature. The tensile stresses may exceed the rupture limit of Al₂O₃ and cause the coating to crack extensively and thus degrade the performance of the cutting edge in, e.g., wet machining where the corrosive chemicals in the coolant fluid may exploit the cracks in the coating as diffusion paths.

Generally CVD-coated tools perform very well when machining various steels and cast irons under dry or wet cutting conditions. However, there exists a number of cutting operations or machining conditions when PVD-coated tools are more suitable, e.g., in drilling, parting and threading and other operations where sharp cutting edges are required. Such cutting operations are often referred to as the "PVD coated tool application area".

Plasma assisted CVD, PACVD, makes it possible to deposit coatings at lower substrate temperatures as compared to thermal CVD temperatures and thus avoid the dominance of the thermal stresses. Thin Al₂O₃ PACVD films, free of cracks, have been deposited on cemented carbides at substrate temperatures of 450–700° C. (U.S. Pat. Nos. 5,516,588 and 5,587,233). The PACVD process for depositing Al₂O₃ includes the reaction between an Al-halogenide, e.g., AlCl₃, and oxygen donor, e.g., CO₂. Because of the incompleteness of this chemical reaction, chlorine is trapped in the Al₂O₃-coating and its content could be as large as 3.5%. Furthermore, these PACVD Al₂O₃-coatings are generally composed of, besides the crystalline alpha- and/or gamma-Al₂O₃-phase, a substantial amount of amorphous alumina which in combination with the high content of halogen impurities, degrades both the chemical and mechanical properties of said coating, hence making the coating material non-optimized as a tool material.

The field of the present invention relates particularly to the art of PVD Al₂O₃ coated cutting tools used in metal machining.

There exist several PVD techniques capable of producing refractory thin films on cutting tools and the most established methods are iron plating, DC- and RF-magnetron sputtering, arc discharge evaporation, IBAD (Ion Beam Assisted Deposition) and Activated Reactive Evaporation (ARE). Each method has its own merits and the intrinsic properties of the produced coatings such as microstructure/grainsize, hardness, state of stress, intrinsic cohesion to the underlying substrate may vary depending on the particular PVD method chosen. Early attempts to PVD deposit Al₂O₃ at typical PVD temperatures, 400–500° C., resulted in amorphous alumina layers which did not offer any notable improvement in wear resistance when applied on cutting tools. PVD deposition by HF diode- or magnetron sputtering resulted in crystalline α-Al2O3 only when the substrate temperature was kept as high as 1000° C. (Thornton and Chin, Ceramic Bulletin, 56(1977)504). Likewise, applying the ARE method for depositing Al₂O₃, only resulted in fully dense and hard Al₂O₃-coatings at substrate temperatures around 1000° C. (Bunshah and Schramm, Thin Solid Films, 40(1977)211).

With the invention of the bipolar pulsed DMS technique (Dual Magnetron Sputtering), which is disclosed in DD 252 205 and U.S. Pat. No. 5,698,314, a wide range of opportunities opened up for the deposition of insulating layers such as Al₂O₃ and, furthermore, the method has made it possible to deposit crystalline Al₂O₃-layers at substrate temperatures in the range of 500 to 800° C. In the bipolar dual magnetron system, the two magnetrons alternately act as an anode and a cathode and, hence, preserve a metallic anode over long process times. At high enough frequencies, possible electrical charging on the insulating layers will be suppressed and the otherwise troublesome phenomenon of "arcing" will be limited. Hence, according to U.S. Pat. No. 5,698,314 the DMS sputtering technique is capable of depositing and producing high-quality, well-adherent, crystalline α-Al₂O₃ thin films at substrate temperatures less than 800° C. The "α-Al₂O₃ layers" with a typical size of the α-grains varying between 0.2 and 2 μm, may partially also contain the gamma (γ) phase from the "γ series" of the Al₂O₃-polymorphs. The size of the γ-grains in the coating is much smaller than the size of the α-grains. The γ-Al₂O₃ grain size typically varies between 0.05 and 0.1 μm. In the Al₂O₃-layers where both modifications of γ and α-phase were found, the γ-Al₂O₃-phase showed a preferred growth orientation with a (440)-texture. When compared to prior art plasma assisted deposition techniques such as PACVD as described in U.S. Pat. No. 5,587,233, the novel, pulsed DMS sputtering deposition method has the decisive, important advantage that no impurities such as halogen atoms, e.g., chlorine are incorporated in the Al₂O₃-coating.

OBJECTS AND SUMMARY OF THE INVENTION

It is an object of this invention to avoid or alleviate the problems of the prior art.

It is further an object of this invention to provide a method of depositing at least one layer of fine-crystalline γ-Al$_2$O$_3$ by reactive magnetron sputtering technique onto a cutting tool for metal machining.

It is an aspect of the invention to provide a process for producing a coated cutting tool having a coating and a substrate, said coating comprising at least one refractory layer consisting of fine-grained, crystalline γ-Al$_2$O$_3$, said process comprising depositing by reactive magnetron sputtering onto a moving substrate in a vacuum by pulsed magnetron sputtering with a mixture of a rare gas and a reactive gas at a pulse frequency set for 10 to 100 kHz, whereby deposition occurs with a rate of at least 1 nm/s with reference to a stationarily arranged substrate, at a magnetron target power density in time average set for at least 10 W/cm$^2$ substrate temperature set in the range of 400 to 700° C., and the flux of impinging particles onto the substrate being cyclically interrupted.

DETAILED DESCRIPTION OF THE PREFERRED EMBODIMENTS OF THE INVENTION

According to the present invention, there is provide an improved method of depositing a hard and wear resistant γ-Al$_2$O$_3$ layer by pulsed magnetron sputtering at substrate temperatures of 400 to 700° C. on a cutting tool for metal machining such as turning (threading and parting), milling and drilling. Said cutting tool comprises a body of a hard material such as cemented carbide, cermets, high speed steel or a superhard material such as cubic boron nitride and/or diamond. The γ-Al$_2$O$_3$-layers consist of high-quality, dense, fine-grained crystalline Al$_2$O$_3$ with a grain size less than 0.1 μm and they are virtually free of cracks and halogen impurities.

The γ-Al$_2$O$_3$ layer may be included in a wear resistant coating composed of one or more layers of refractory compounds at which the γ-Al$_2$O$_3$-layer preferably is the outermost layer and the innermost layer(s), if any at all, between the tool body and the Al$_2$O$_3$-layer, is composed of metal nitrides, carbonitrides and/or carbides with the metal elements selected from Ti, Nb, Hf, V, Ta, Mo, Zr, Cr, W and Al.

In contrast to the state of the art, the γ-Al$_2$O$_3$-layers according to the present invention further give the cutting edges of the tool an extremely smooth surface finish which, compared to prior art α-Al$_2$O$_3$ coated tool, results in an improved surface finish also of the workpiece being machined. The very smooth surface finish can be attributed to the very fine crystallinity of the coating. The "γ-Al$_2$O$_3$"-layers may also partially contain other phases from the "γ-series" like θ, δ and η.

The fine-grained, crystalline γ-Al$_2$O$_3$ according to the present invention is strongly textured in the [440]-direction, A Texture Coefficient, TC, can be defined as:

$$TC(hkl) = \frac{I(hkl)}{I_o(hkl)} \left\{ \frac{1}{n} \sum \frac{I(hkl)}{I_o(hkl)} \right\}^{-1}$$

where
I(hkl)=measured intensity of the (hkl) reflection
I$_o$(hkl)=standard of intensity from the ASTM standard powder pattern diffraction data
n=number of reflections used in the calculation
(hkl) reflections used are: (111), (311), (222), (400) and (440) and whenever the TC(hkl)>1, there is a texture in the [hkl]-direction. The larger of the value of TC(hkl), the more pronounced is the texture. According to the presently claimed invention, the TC for the set of (440) crystal planes is greater than 1.5.

When the very fine-grained γ-Al$_2$O$_3$ coated cemented carbide cutting tools according to the invention are used in the machining of steel or cast iron, several important improvements compared to prior art have been observed. Surprisingly, the PVD γ-Al$_2$O$_3$ without containing any portion of the coarser and thermodynamically stable α-Al$_2$O$_3$-phase, shows, in certain metal machining operations, a wear resistance which is equal to the wear resistance found in coarser CVD α-Al$_2$O$_3$-coatings deposited at temperatures around 1000° C. Furthermore, the fine-grained PVD γ-Al$_2$O$_3$-coatings show a wear resistance considerably better than prior art PVD-coatings. These observations open up the possibility to considerably improve the cutting performance and prolong the tool lives of coated PVD tools. The low deposition temperature will also make it possible to deposit PVD γ-Al$_2$O$_3$-coatings on high-speed steel tools.

A further improvement in cutting performance can be anticipated if the edges of the γ-Al$_2$O$_3$ coated cutting tools according to the invention are treated by a gentle wet-blasting process or by edge brushing with brushes based on, e.g., SiC, as disclosed in U.S. Pat. No. 5,861,210.

The total coating thickness according to the present invention varies between 0.5 and 20 μm, preferably between 1 and 15 μm, with the thickness of the non-Al$_2$O$_3$-layer(s) varying between 0. 1 and 10 μm, preferably between 0.5 and 5 μm. The fine-grained γ-Al$_2$O$_3$-coating can also be deposited directly onto the cutting tool substrate and the thickness of said γ-Al$_2$O$_3$ varies then between 0.5 and 15 μm, preferably between 1 and 10 μm. Similarly, further layers of metal nitrides and/or carbides with the metal elements selected from Ti, Nb, Hf, V, Ta, Mo, Zr, Cr, W and Al can be deposited on top of the Al$_2$O$_3$-layer.

The γ-Al$_2$O$_3$ layer according to the presently claimed invention is deposited by pulsed magnetron sputtering at a substrate temperature of 400–700° C., preferably 500–600° C., using aluminum targets and a mixture of at least one rare and at least one reactive gas, preferably argon and oxygen. A preferred solution to carry out the pulsed magnetron sputtering process is the usage of a Dual Magnetron System (DMS). Additionally, the process according to the presently claimed invention is characterized in cyclic interruptions of the flux of particles impinging onto each individual substrate. This flux comprises neutrals, ions, electrons, photons, etc. It seems that these interruptions cause renucleation processes resulting in the observed very fine grained structure of the γ-Al$_2$O$_3$ layer. One easy way to realize said cyclic interruptions of the flux is to fixture the substrates on a cylindrical basket which rotates in from of the magnetrons, hence causing the substrates moving in and out of the plasma deposition zone. Alternatively, the cyclic interruptions can also be attained by shadowing the targets or substrate or by interrupting the power supply of the sputtering devices. The frequency of said cyclic interruptions is between 0.1 and 10 per minute. The duration of the interruption of the flux of the impinging particles is at least 10% of the duration of the whole period. Alternatively the cyclic interruption of the flux of impinging particles occurs a periodically. A further characteristic of the process is setting the flow of the reactive gas for such a value that the impedance of the magnetron discharge lies between 150% and 250% of the impedance of a discharge burning between totally oxide-covered target electrodes. This totally oxide-covered state of the targets is indicated by a drastically reduced deposition rate and the presence of oxygen lines in the optical emission spectrum of the plasma. Further, an improvement in the microstructure and phase composition of the $\gamma$-$Al_2O_3$ layer will be achieved by applying a bipolar pulsed bias voltage to the substrates during the deposition. This bipolar bias voltage is preferably asymmetric for both polarities with regard to at least one of the parameters voltage level and pulse duration. This leads to an alternating flux of ions and electrons necessary for the cyclic discharge of the growing insulating layer. Preferred is a bias voltage level between 20 and 200 V, preferably between 50 and 100 V, at frequency in the range of 1–5 kHz. Depending on the geometric conditions of the deposition arrangement, an asymmetric bias pulsing with regard to the parameters voltage level and the pulse duration can be useful. In this case, the duration of the positive polarity should be significantly lower than or at most equal to the duration of the negative polarity. Preferably, the pulse bias frequency lies in the range of 100 Hz to 10 kHz, preferably in the range of 1 kHz to 5 kHz, and the duration of the positive polarity of the substrate is at most equal to, preferably 5 to 20 times lower, than the duration of the negative polarity.

The layer(s) described above, comprising metal nitrides and/or carbides and/or carbonitrides and with the metal elements selected from Ti, Nb, Hf, V, Ta, Mo, Zr, Cr, W and Al can be deposited by PVD-technique, CVD- and/or MTCVD-technique (Medium Temperature Chemical Vapor Deposition).

The invention is additionally illustrated in connection with the following Example which is to be considered as illustrative of the present invention. It should be understood, however, that the invention is not limited to the specific details of the Example.

EXAMPLE

A) Commercially available cemented carbide threading inserts of style R166. OG-16MMOI-150, having a composition of 10 w % Co and balance WC, coated with an approximately 2 $\mu$m TiN-layer by an ion plating technique.

B) TiN coated tools from A) were coated with a 1 $\mu$m fine-grained $\gamma$-$Al_2O_3$-layer in a separate experiment with the pulsed magnetron sputtering technique. The deposition temperature was set for 650° C. The total pressure of the gas mixture consisting of argon and oxygen was set for 1.5 $\mu$bar. The working point of the reactive magnetron discharge was controlled by the oxygen flow in such a mode that the impedance of the discharge was set to 200% of the impedance measured with totally oxide covered target electrodes of the used DMS. A cyclic interruption of the particle flux towards each individual substrate was realized by rotating an arrangement of substrates and shields in front of a DMS during deposition. During the deposition process, a rectangular shaped bipolar pulsed bias voltage of 50 V for both polarities and a frequency of 5 kHz was applied onto the substrates.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A process for producing a coated cutting tool having a coating and a substrate, said coating comprising at least one refractory layer consisting of fine-grained, crystalline $\gamma$-$Al_2O_3$, said process comprising depositing by reactive magnetron sputtering onto a moving substrate in a vacuum by pulsed magnetron sputtering with a mixture of a rare gas and a reactive gas at a pulse frequency set for 10 to 100 kHz, the flow of the reactive gas is set so that the impedance of the magnetron discharge lies between 150% and 250% relative to the impedance of a discharge burning between totally oxide-covered target electrodes at the point where an oxygen line is present in an optical emission spectrum of the plasma, whereby deposition occurs with a rate of at least 1 nm/s with reference to a stationarily arranged substrate, at a magnetron target power density in time average set for at least 10 W/cm$^2$, the moving substrate temperature set in the range of 400 to 700° C., applying a bipolar pulse bias voltage to the substrate during deposition, and the flux of impinging particles onto the moving substrate being cyclically interrupted.

2. The process of claim 1 wherein the pulse frequency is set for 20–50 kHz.

3. The process of claim 1 wherein the moving substrate temperature is in the range of 500 to 600° C.

4. The process of claim 1 wherein the rare gas is argon.

5. The process of claim 1 wherein the reactive gas is oxygen.

6. The process of claim 1 wherein the cyclic interruption of the flux of impinging particles occurs periodically with a frequency in the range between 0.1 interruptions per minute and 10 interruptions per minute.

7. The process of claim 6 wherein the duration of the interruption of the flux of the impinging particles onto the moving substrate is at least 10% of the duration of the whole period defined by all fluxes and interruptions for depositing onto a particular substrate.

8. The process of claim 1 wherein the cyclic interruption of the flux of impinging particles occurs aperiodically.

9. The process of claim 1, wherein the applied bipolar bias voltage is asymmetric for both polarities with regard to at least one of the parameters of voltage level and pulse duration.

10. The process of claim 9 wherein the maximum value of bias voltage in each pulse lies in the range of 20 V to 200 V.

11. The process of claim 10 wherein each pulse lies in the range of 50 V and 100 V.

12. The process of claim 10 wherein additional, non-$Al_2O_3$-layers are deposited by a Physical Vapor Deposition process.

13. The process of claim 12 wherein the non-$Al_2O_3$-layers are deposited by pulsed magnetron sputtering.

14. The process of claim 10 wherein additional, non-$Al_2O_3$-layers are applied by a Chemical Vapor Deposition process.

15. The process of claim 1, wherein the pulse frequency lies in the range of 100 Hz to 10 kHz, and the duration of the positive polarity of the substrate is at most equal to the duration of the negative polarity.

16. The process of claim 15 wherein the pulse frequency is in the range of 1 kHz to 5 kHz.

17. The process of claim 16 wherein the duration of the positive polarity is 5 to 20 times lower than the duration of the negative polarity.

18. The process of claim 1 wherein the $Al_2O_3$-layer is deposited by the sputtering of two magnetrons with Al targets that are alternatively switched as a cathode and as an anode of a magnetron sputtering apparatus.

19. The process of claim 1, wherein the γ-$Al_2O_3$ is textured in the [440] direction.

20. The process of claim 1 wherein all layers are deposited without vacuum interruption.

* * * * *

UNITED STATES PATENT AND TRADEMARK OFFICE
CERTIFICATE OF CORRECTION

PATENT NO.      : 6,451,180 B1  
DATED           : September 17, 2002  
INVENTOR(S)     : Siegfried Schiller et al.

It is certified that error appears in the above-identified patent and that said Letters Patent is hereby corrected as shown below:

<u>Title page,</u>  
Item [73], Assignee, please add:  
-- Fraunhofer-Gesellschaft zur Förderung der angewandten Forschung e.V., München, Germany --

Signed and Sealed this

Sixteenth Day of September, 2003

JAMES E. ROGAN  
*Director of the United States Patent and Trademark Office*